United States Patent [19]

Smith et al.

[11] Patent Number: 4,460,841

[45] Date of Patent: Jul. 17, 1984

[54] ULTRASONIC TRANSDUCER SHADING

[75] Inventors: Lowell S. Smith, Schenectady, N.Y.; Axel F. Brisken, Shingle Springs, Calif.

[73] Assignee: General Electric Company, Schenectady, N.Y.

[21] Appl. No.: 349,143

[22] Filed: Feb. 16, 1982

[51] Int. Cl.[3] .................... H01L 41/04; H04R 17/00

[52] U.S. Cl. .................................. 310/334; 310/358; 310/365; 367/155; 367/905

[58] Field of Search ............... 367/905, 153, 154, 155, 367/164; 310/358, 367, 369, 334, 336, 357, 359, 365

[56] References Cited

U.S. PATENT DOCUMENTS

| | | | |
|---|---|---|---|
| 2,411,551 | 11/1946 | Mason | 367/905 |
| 2,427,062 | 9/1947 | Massa | 367/155 |
| 2,837,728 | 6/1958 | Schuck | 367/153 |
| 2,875,355 | 2/1959 | Petermann | 310/358 |
| 2,928,068 | 3/1960 | Samsel et al. | 367/165 |
| 2,956,184 | 10/1960 | Pollack | 367/905 |
| 4,271,490 | 6/1981 | Minohara et al. | 367/122 |
| 4,287,770 | 9/1981 | Weyns | 73/632 |
| 4,291,396 | 9/1981 | Martin | 367/154 |
| 4,305,014 | 8/1981 | Borburgh et al. | 310/334 |

*Primary Examiner*—Richard A. Farley
*Attorney, Agent, or Firm*—Donald R. Campbell; James C. Davis, Jr.; Paul R. Webb

[57] ABSTRACT

The radiation pattern of shaded single element piezoelectric transducers and transducer arrays has reduced side lobe levels. Shading to reduce the intensity of emitted ultrasound at the edges of the transducer relative to the center is realized by varying the electric/acoustic conversion efficiency or polarization of the piezoelectric material, by having different mechanical element lengths, by selectively poling the piezoelectric material to produce poled and unpoled regions, and by control of electrode geometry. The shading of a phased array ultrasonic transducer is described in both lateral dimensions.

5 Claims, 11 Drawing Figures

Fig. 6
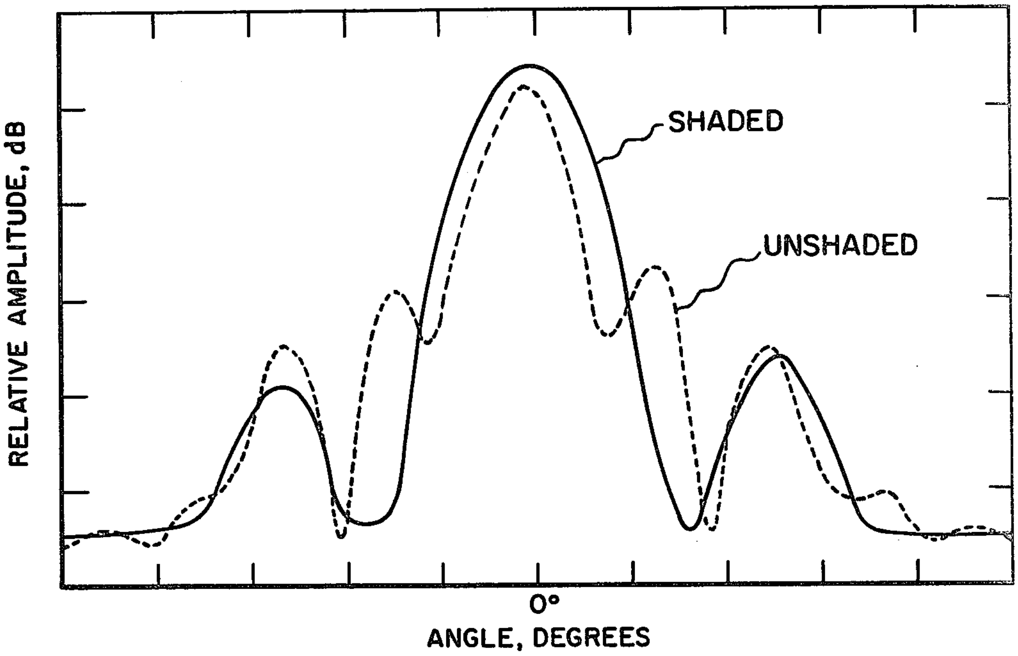
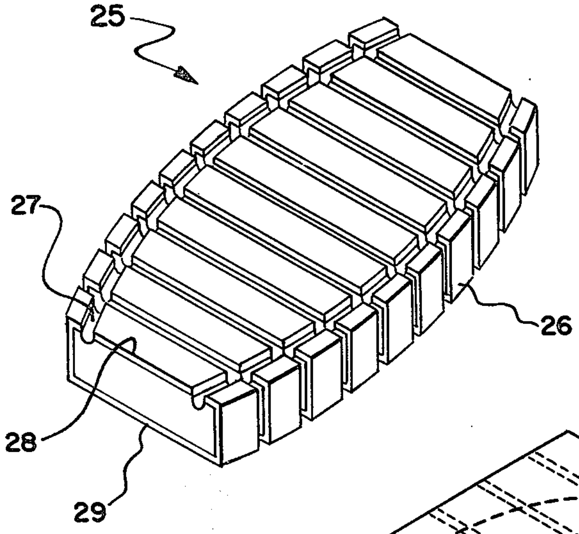
Fig. 7
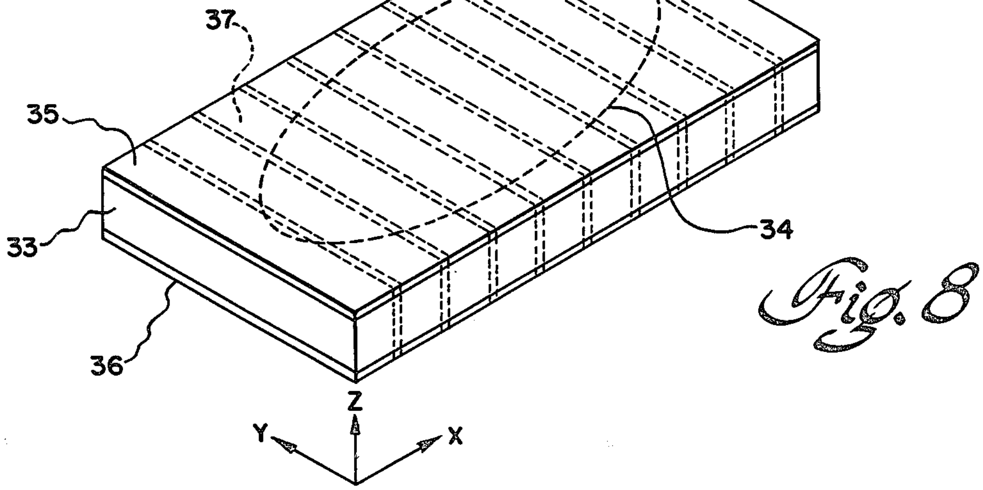
Fig. 8

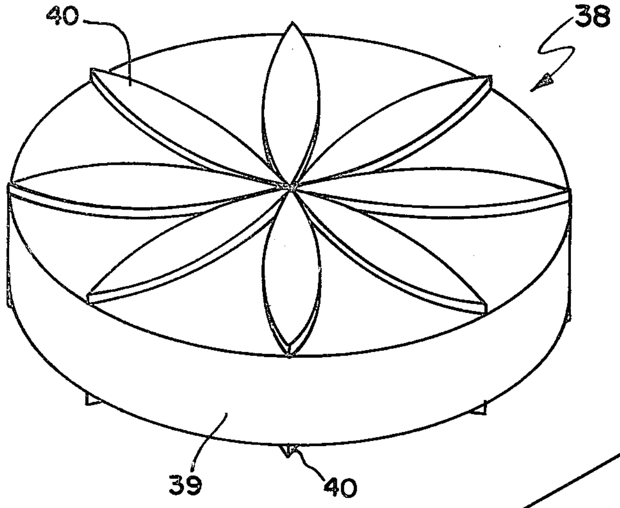
Fig. 9
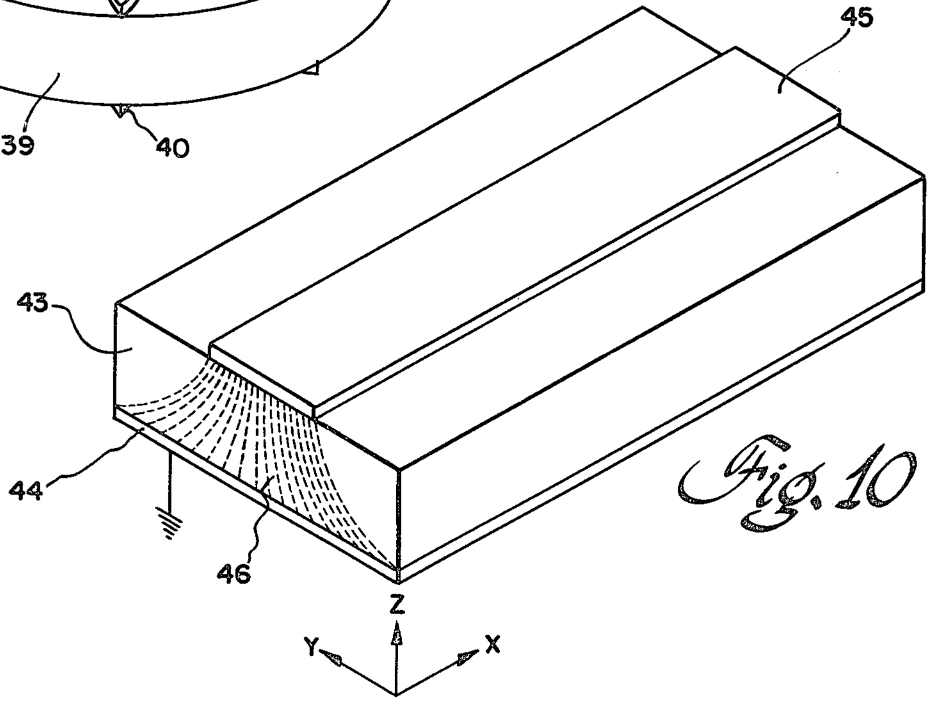
Fig. 10
Fig. 11
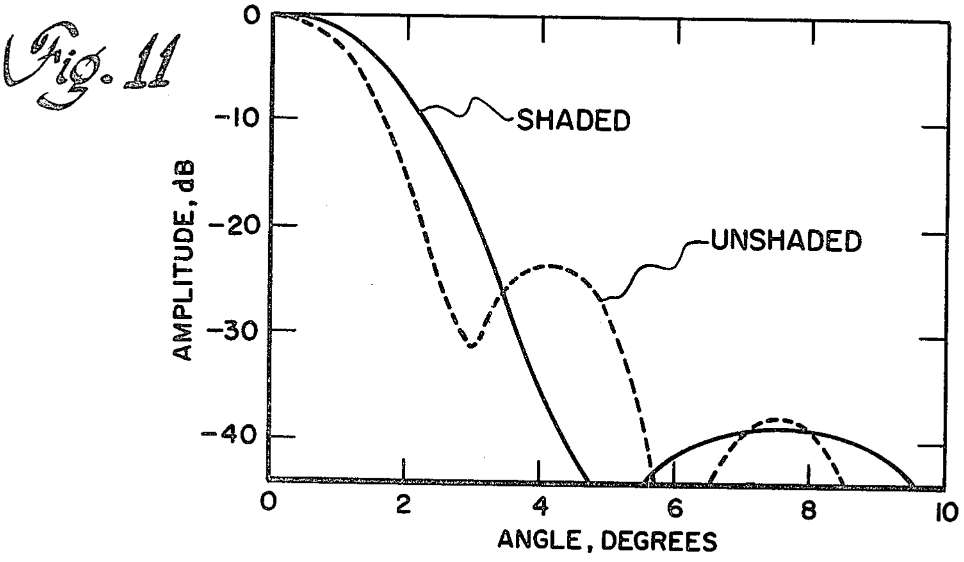

ULTRASONIC TRANSDUCER SHADING

BACKGROUND OF THE INVENTION

This invention relates to improving the radiation patterns of ultrasonic transducers.

A rectangular phased array radiative aperture with uniform acoustic emission results in a radiative diffraction pattern as sketched in FIG. 1. Side lobes typically start at the −13.3 dB level (one way) and contribute to a noise floor at perhaps the −26.5 dB level. A preferred radiation pattern is shown in FIG. 2 and represents a slightly degraded lateral resolution (the main lobe is wider) but a vastly improved reduction in diffraction side lobes. The medical argument of the desirability of suppressing the side lobes is seen from the following. If the diagnostician is examining a body structure like the heart that produces strong echoes and then wants to look at a nearby weak reflector, he gets an integral of the weak reflector plus the strong reflector and there are undesirable image artifacts.

It has been shown that the desired improvement in diffraction side lobes is achieved by an electronic amplitude technique, by attenuating the transmit and receive electrical signals to and from the piezoelectric ceramic elements. In the X-axis along the array, elements near the center are unattenuated while elements toward the ends of the array suffer strong attenuations. Specific attenuation functions are described as raised cosine, Hamming, and trapezoid; the latter has been used in various clincal evaluations of the phased array imaging system in U.S. Pat. No. 4,155,260 and other patents assigned to this assignee. Adding appropriate attenuators to the transmit and receive circuits, however, increases the electronics complexity and cost. The beam profile in the perpendicular plane (Y-axis) cannot be altered by the system electronics. As a consequence, the Y-axis beam profile is determined solely by the array architecture. Conventional array construction results in Y-axis beam profiles which exhibit substantial side lobe levels.

SUMMARY OF THE INVENTION

Ultrasonic transducers are shaded by several techniques including reducing the piezoelectric conversion efficiency, changing the mechanical element length, selective piezoelectric poling, and control of electrode geometry. The intensity of emitted ultrasound is higher at the center of the transducer and lower at the edges, and there is a reduction in side lobe levels. The improved beam pattern results in improved image quality and in some cases no change in the electronics is called for. There are many possible transducer configurations and the following are illustrative (all but the last two can be linear phased array transducers).

One embodiment has X-axis shading along the array because the polarization of the elements changes as a function of position and is reduced at the ends of the array as compared to the center. The variation of polarization depends on the selected shading function. In such an array with Y-axis shading, the polarization changes parallel to the element length. A second embodiment is an X- and Y-axis shaded linear array which has different length elements, the elements at the ends being shorter than central elements. An elliptically-shaped array has elements with different electrical impedances. A third major embodiment is an X- and Y-axis shaded array which has selectively poled piezoelectric material and poled regions at the center of the array and unpoled regions at the edges. A circular single element transducer is selectively poled such that the fraction of poled to unpoled region is high at the center and decreases toward the edge. The fourth embodiment has Y-axis shading via electrode geometry, specifically that one electrode covers the whole length of the element and the other electrode a fraction of the length.

The side lobe reduction and high sensitivity of such shaded transducers has proven to be more important than optimum resolution for diagnostic ultrasound.

BRIEF DESCRIPTION OF THE DRAWINGS

FIG. 6 shows the different radiation patterns obtained from a device with reduced polarization at both ends (full lines) and uniform polarization (dashed lines);

FIG. 7 is a partial perspective view of a shaded phased array transducer with different element lengths;

FIG. 8 depicts a perspective view of a selectively poled piezoelectric slab ready to be cut into the elements of a shaded array;

FIG. 9 depicts a single element transducer which is shaded by selectively poling in a rosette pattern;

FIG. 10 illustrates a single element transducer which is Y-axis shaded by control of electrode geometry; and FIG. 11 represents the beam profiles of shaded and unshaded transducers which have different electrode geometries.

DESCRIPTION OF THE PREFERRED EMBODIMENTS

Figure 1:
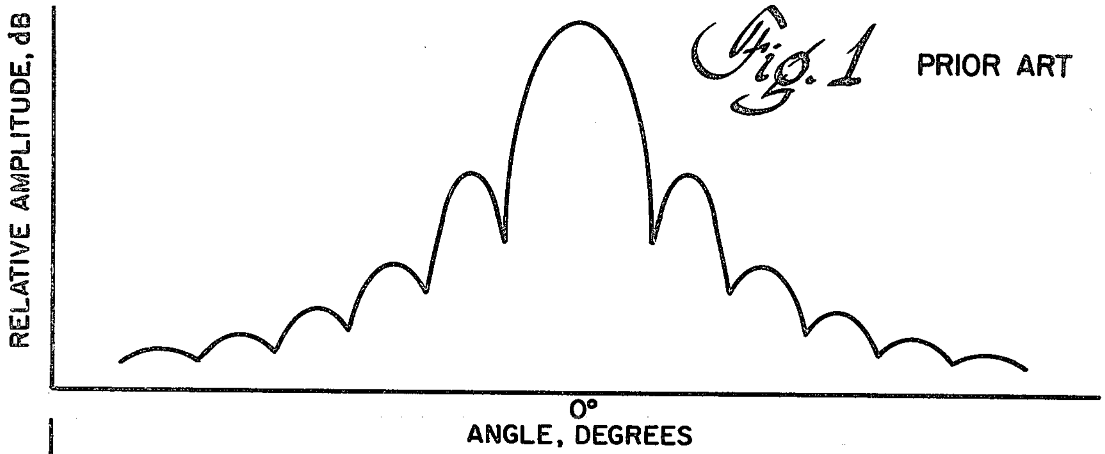
Fig. 1 PRIOR ART
FIG. 1 shows a prior art diffraction pattern from an unshaded rectangular aperture.
Figure 2:
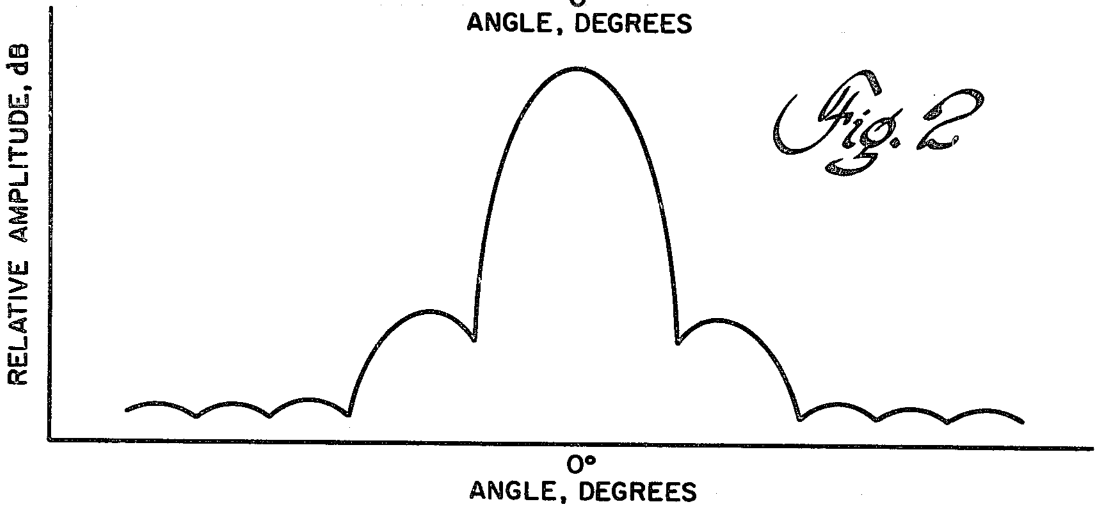
FIG. 2 shows the diffraction pattern from a shaded rectangular aperture.
Figure 3:
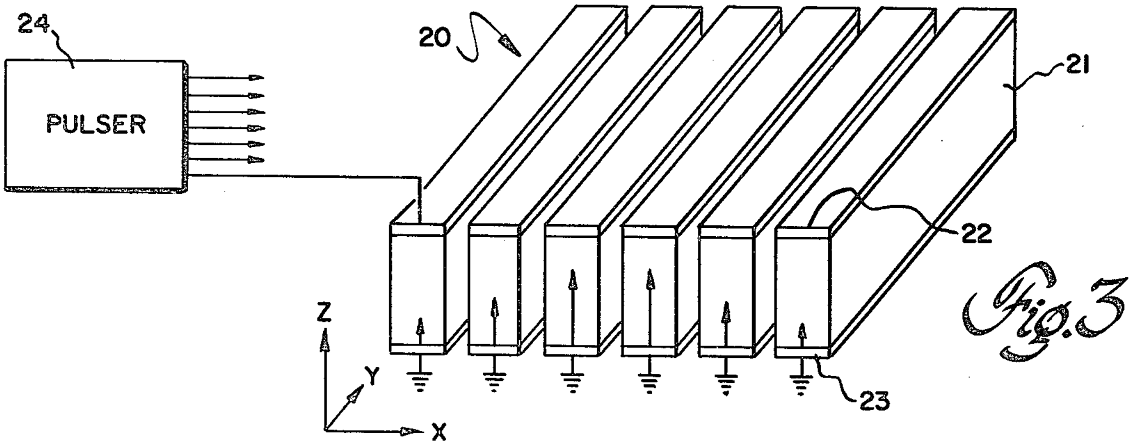
FIG. 3 is a perspective view of a linear transducer array shaded along the X-axis by varying the polarization.

The linear phased array ultrasonic transducer 20 in FIG. 3 is shaded by varying the polarization of the piezoelectric material as a function of position. The desired reduction in diffraction side lobes is achieved such as in FIG. 2. Unlike the electronic amplitude technique of shading, in which the rectangular aperture of the transducer is shaded by attenuating the transmit and receive electrical signals to and from the elements, each of the transducer elements 21 is excited with the same transmit waveform and received echoes are given no further electronic attenuation. Every long, narrow piezoelectric ceramic element 21 has signal and ground electrodes 22 and 23 on opposite surfaces and a thickness of one-half wavelength at the emission frequency since the element operates essentially as a half wave resonator. For medical diagnostics, the ultrasound emission frequency is typically 2–5 MHz. Other features of the transducer array, such as the quarter-wave impedance matching layers on the front surface, the wear plate, and the fabrication of the device, are described in detail in the inventors' U.S. Pat. No. 4,217,684, the disclosure of which is incorporated herein by reference.

Figure 4:
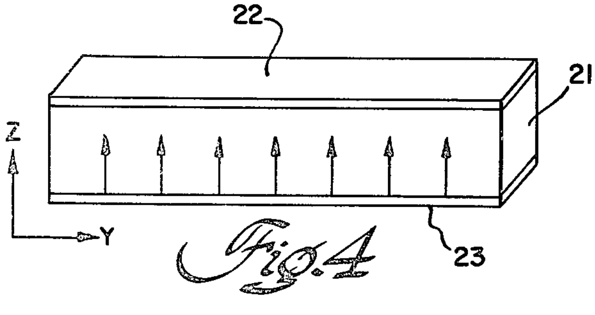
FIG. 4 is a perspective of one of the elements in FIG. 3.

FIGS. 3 and 4 relate to X-axis shading along the array and parallel to its length (the Z-axis goes into the body). The arrows represent polarization or the coupling coefficient k. The piezoelectric material is strongly poled at the center of the array and more weakly poled at the ends. The change in polarization from the center of the array to the ends depends on the selected shading function, such as the Hamming or raised cosine shading function, and there are many others. The choice depends on the specific requirement and the need to retain good resolution considering that a uniformly weighted aperture gives the best resolution. In the Y-axis direction parallel to the long dimension of the element, the polarization is uniform. All of the array elements 21 are excited by the pulser 24 with the same transmit waveform, but the electric/acoustic conversion efficiency varies along the array and the intensity of emitted radiation is greater at the center than at the ends.

Effective non-uniform conversion efficiency may be achieved in several ways. The preferred technique is to pole the material by applying a relatively long high voltage pulse, then a short low voltage pulse to monitor the polarization of the element. This is done repetitively, monitoring the result after every high voltage pulse. A second technique is to apply a nonuniform high voltage poling field to the ceramic slab with the highest electric fields in the center of the array and reduced fields at the edges. The poling device may consist of a curved conductive plate with added dielectric at the edges or a flat resistive plate with high voltage applied to the middle and ground beyond the edge of the ceramic. Another technique is applying a thermal gradient to the piezoelectric slab, with heat at the edges and cooling in the middle, to appropriately depole a completely and uniformly poled piece of ceramic. A fourth technique is to coat a uniformly poled slab of piezoelectric ceramic with a continuous but porous electrode, with greater porosity at the edges. The ceramic slab is subsequently cut into array elements.

Figure 5:
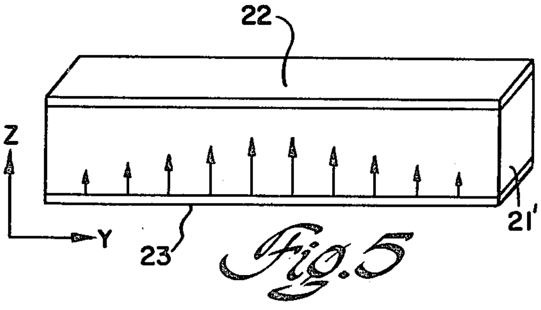
FIG. 5 is a perspective of one element when the array in FIG. 3 has Y-axis and X-axis shading.

So far side lobe reduction only in the X-direction has been described. Phased arrays may need to be shaded for the Y-axis also, to essentially yield an elliptical or circular aperture, very much like a conventional B-scan transducer. In FIG. 5 the polarization parallel to the length of element 21' changes and is greater at the center and decreases symmetrically toward either end. This array has both X-axis and Y-axis shading and the variation of polarization along the array may be as shown in FIG. 3. One way of poling element 21' is to cut the electrodes into segments and pole each segment by repetitively applying a high voltage pulse and monitoring the polarization. Later the cut electrode is made continuous.

The results of one experiment in which the acoustic aperture of an ultrasonic transducer was shaded by reducing the conversion efficiency at the edges is shown in FIG. 6. Two nominally identical pieces of Channel 5500 piezoelectric ceramic were cut to the same lateral dimensions (approximately ½ in×⅝ in) and same thickness (approximately 0.7 mm). Both pieces have electrodes on their large faces. One piece was selected for the reduced conversion efficiency sample, while the other remained as a control. The control sample had been polarized at the manufacturing facility and was assumed to be uniformly poled. The electrode on the other piece was cut into three equal area pieces by two parallel cuts which were just deep enough to separate the electrodes. The end electrodes were attached to the terminal of a high voltage source and were depolarized. Tests with a piezoelectric coupling constant meter confirmed the reduction in piezoelectric activity of the end segments compared to the center.

FIG. 6 shows the different radiation patterns obtained from these two devices. The control or unshaded sample had a narrower beam caused by the wider effective aperture, but the side lobes are relatively large. Diffraction theory predicts −26 dB (two way) side lobes for this case. The shaded, reduced polarization sample has a wider main lobe but there is a significant reduction in the side lobes. The amplitude of the first side lobe is approximately the same as that of a second side lobe of the control sample. The general features of the radiation patterns are in good agreement with diffraction theory.

The technique is applicable to any piezoelectric transducer. Because the aperture of linear and phased array transducers is rectangular, this technique produces more dramatic effects on these devices. Changes in system electronics are not required, and existing ultrasonic instruments can be improved by merely changing the transducer.

Another way of shading a linear phased array ultrasonic transducer is by having different mechanical element lengths. In FIG. 7, transducer array 25 is roughly elliptical and elements 26 at the ends of the array have a reduced area and are shorter than the central elements. This shaded transducer array is fabricated as taught in U.S. Pat. No. 4,217,684. A fully and uniformly poled slab of piezoelectric is plated on all six sides, isolation slots 27 are cut into the top surface to separate the signal electrode 28 from the wrap-around ground electrode 29, and the piece is cut into individual elements. Inner elements have the usual length and narrow Y-axis radiation patterns while outer elements are short and have wide radiation patterns. Assuming perfect phase quantization, this device approaches a B-scan aperture. Care is taken to include amplitude shading effects on receive due to the change in element/cable capacitance ratio.

A third major technique of shading a phased array ultrasonic transducer is by selective piezoelectric poling. Referring to FIG. 8, an unpoled piezoelectric slab 33 is temporarily plated on both surfaces only over the selected ellipitcal (or circular) aperture 34 and is poled uniformly under this electrode. The piezoelectric ceramic slab 33 is fully plated to provide signal and ground electrodes 35 and 36 by the standard array fabrication process and cut into individual elements 37. Even though electrodes cover the full rectangular aperture, electric/acoustic conversion occurs only in the selectively poled region. All elements now also have approximately the same capacitance to alleviate the element/-cable capacitance variation problem. This embodiment of the shaded linear array has X- and Y-axis shading and reduced side lobe levels, and changing the geometry of the poled region changes the shading function.

The shaded single element circular transducer 38 in FIG. 9 is selectively poled. The top and bottom surfaces of the unpoled piezoelectric slab 39 are provided with rosette electrodes 40 which are aligned and have many petals extending from the center to the edge. The material under the rosette electrode is poled by applying a high voltage; the material outside of the electrodes remains unpoled. Thereafter the slab is fully plated on on both sides. If one looks at concentric annuli starting at the center, the fraction of poled area is high at the center and decreases toward the edges. Electric/acoustic conversion occurs only in the selectively poled region, and the intensity of the emitted ultrasound is largest at the center and decreases toward the edges.

A fourth technique of shading an ultrasonic transducer is by electrode geometry. This is not suitable for phased array transducers but does realize Y-axis shading of large slab single element transducers and linear array transducers in which groups of elements are excited in sequence. The basic principle of Y-axis shading via electrode geometry is illustrated in FIG. 10. The piezoelectric slab 43 is uniformly polarized and the front surface of the element has a continuous electrode 44 extending over its entire length. The back surface, however, has a continuous electrode 45 extending over only a fraction of the length of the element. This electrode geometry results in non-uniform electric field lines 46 across the ceramic.

Test data was taken on a transducer which had a continuous front electrode and a discontinuous back electrode which was segmented into five electrodes of approximately equal area. By shorting an appropriate number of the segments together, a number of electrode geometries were tested. The results of beam pattern measurements for two different geometries are presented in FIG. 11. The solid curve represents the beam profile obtained when the center three electrodes were shorted together (the electrode is over 60 percent of the back surface). and the dashed curve is the beam profile obtained when the entire back electrode was shorted together. The side lobe level is greatly reduced and the main lobe resolution is slightly reduced for three electrodes as compared to five electrodes. The partial electrode does not merely reduce the size of the effective aperture, but also serves to shade the aperture.

The foregoing transducer configurations discriminate against information from the outer edge of the aperture, and lead to better side lobe reduction throughout the imaged area at the expense of somewhat poorer resolution at longer range. Clinical experience is that side lobe reduction and high sensitivity are often more important than good resolution for diagnostic ultrasound.

The concurrently filed application Ser. No. 349,146, now U.S. Pat. No. 4,425,525 "Ultrasonic Transducer Array Shading", L. S. Smith, A. F. Brisken, and M. S. Horner, describes an array with generally diamond-shaped transducer elements for Y-axis shading. This is the presently known best mode for real time imaging using a phased array system. The two inventions are commonly assigned.

While the invention has been particularly shown and described with reference to preferred embodiments thereof, it will be understood by those skilled in the art that the foregoing and other changes in form and details may be made therein without departing from the spirit and scope of the invention.

The invention claimed is:

1. A linear phased array ultrasonic transducer having X-axis and Y-axis shading comprising: a plurality of long, narrow piezoelectric ceramic transducer elements each having electrodes on opposite surfaces, the polarization of said elements varying as a function of position in the X-axis direction along the array depending on a selected shading function, and varying in the Y-axis direction parallel to the long dimension of every element such that the polarization is greater at the center and decreases symmetrically toward either end, whereby the radiation pattern of said shaded array has reduced side lobe levels.

2. The ultrasonic transducer of claim 1 wherein said selected shading function is the raised cosine or Hamming.

3. A linear phased array ultrasonic transducer having X-axis and Y-axis shading along the array and perpendicular thereto comprising: a plurality of piezoelectric ceramic transducer elements each having electrodes on opposite surfaces, said array being generally elliptical and said elements having different mechanical lengths and elements at the ends are shorter than central elements, whereby the radiation pattern of said shaded array has reduced side lobe levels.

4. A linear phased array ultrasonic transducer having X-axis and Y-axis shading along the array and perpendicular thereto comprising: a plurality of long, narrow transducer elements of piezoelectric ceramic material each having electrodes on opposite surfaces, said piezoelectric material being selectively poled such that there is a uniformly poled region at the center of the array and unpoled regions at the edges of the array, whereby electric/acoustic conversion occurs only in the selectively poled region and the radiation pattern of the array has reduced side lobe levels.

5. The ultrasonic transducer of claim 4 wherein said uniformly poled region is elliptical.

* * * * *